United States Patent
Moon

(10) Patent No.: US 7,830,695 B1
(45) Date of Patent: Nov. 9, 2010

(54) CAPACITIVE ARRANGEMENT FOR QUBIT OPERATIONS

(75) Inventor: Jeong-Sun Moon, Moorpark, CA (US)

(73) Assignee: HRL Laboratories, Malibu, CA (US)

( * ) Notice: Subject to any disclaimer, the term of this patent is extended or adjusted under 35 U.S.C. 154(b) by 243 days.

(21) Appl. No.: 11/927,402

(22) Filed: Oct. 29, 2007

Related U.S. Application Data

(60) Provisional application No. 60/855,634, filed on Oct. 30, 2006.

(51) Int. Cl.
*G11C 13/00* (2006.01)
*G11C 11/34* (2006.01)
*G11C 11/44* (2006.01)
*H01L 31/00* (2006.01)

(52) U.S. Cl. .................. 365/106; 365/114; 365/162; 257/14

(58) Field of Classification Search .............. 257/14, 257/194, 321; 324/663; 365/106, 114, 162
See application file for complete search history.

(56) References Cited

U.S. PATENT DOCUMENTS

| | | | | |
|---|---|---|---|---|
| 5,103,183 A | * | 4/1992 | Klein et al. | 324/663 |
| 6,586,785 B2 | * | 7/2003 | Flagan et al. | 257/321 |
| 6,597,010 B2 | * | 7/2003 | Eriksson et al. | 257/14 |
| 6,720,589 B1 | * | 4/2004 | Shields | 257/194 |
| 6,903,383 B2 | * | 6/2005 | Yokogawa et al. | 257/194 |
| 6,974,967 B2 | * | 12/2005 | Komori | 257/14 |
| 7,005,669 B1 | * | 2/2006 | Lee | 257/14 |
| 7,382,017 B2 | * | 6/2008 | Duan et al. | 257/321 |

OTHER PUBLICATIONS

Beenakker et al., "Charge Detection Enables Free-Electron Quantum Computation," Physical Review Letters, vol. 93, Jul. 2004.

* cited by examiner

*Primary Examiner*—Trong Phan
(74) *Attorney, Agent, or Firm*—Ladas & Parry

(57) ABSTRACT

A capacitive operation method for quantum computing is disclosed where providing a sequence of write pulses above a threshold voltage induces a single charge population, forming a quantum dot (Q-dot). Determining if the single charge population was induced in the Q-dot occurs by monitoring capacitance changes while the writing is performed. Q-bits (Q-dot pairs) are formed without requiring a separate transistor for each Q-dot by multiplexing the calibration. A device which is able to perform the above method is also disclosed. The device utilizes the ability of cryogenic capacitance bridge circuits to measure the capacitance change caused by the introduction of a single charge population to a Q-dot. The device also permits swapping of Q-dot and Q-bit pairs utilizing a signal multiplexed with the voltage pulses that write (e.g. change the charge population) to the Q-dots.

17 Claims, 6 Drawing Sheets

| Reference Number | Description | Values |
| --- | --- | --- |
| V501 | AC voltage source | Magnitude = 1 V<br>Angle = 0 degrees<br>DC Offset = 0 V |
| V502 | AC voltage source | Magnitude = 10 μV<br>Angle = 0 degrees<br>DC Offset = 0 V |
| V503 | DC voltage source | Magnitude = 0.1 V |
| V504 | DC voltage source | Magnitude = 0.1 V |
| V505 | DC step voltage source | Start = 0 V<br>Step = 1 V<br>Stop = 5V |
| C501 | Reference Capacitor | Capacitance = 1 pF |
| C502 | Q-Bits to be calibrated | Capacitance = TBD<br>(typically 1 pF range) |
| C503 | Capacitor | Capacitance = 100-1000 pF |
| C504 | Capacitor | Capacitance = 100 pF |
| R501 | Resistor | Resistance = 10 MΩ |
| R502 | Resistor | Resistance = 1.2 KΩ |
| R503 | Resistor | Resistance = 1 Ω |
| R504 | Resistor | Resistance ≈ 0 Ω |
| ATL501 | Alumina Transmission Line | Width = 40 μm<br>Length = 100 μm<br>Acc = 1 |
| FET501 | I-1519 1x25μm HEMT | G = 0.1 S<br>T = 0 ns<br>F = 0GHz<br>CGS = 0 pF<br>GGS = 1 S<br>RI = 1 Ω<br>CDG = 0 pF<br>CDC = 0 pF<br>CDS = 0 pF<br>RDS = 100 Ω<br>RS = 0 Ω |

Fig. 6

CAPACITIVE ARRANGEMENT FOR QUBIT OPERATIONS

CROSS REFERENCE TO RELATED APPLICATIONS

This application claims benefit to U.S. provisional application 60/855,634 filed on Oct. 30, 2006, for "A Capacitive Arrangement for Qubit Operations" by Jeong-Sun Moon, the disclosure of which is incorporated herein by reference.

FIELD

The present disclosure relates to quantum computing. In particular, it relates to capacitive calibration/read/write methods and devices for qubit operations.

BACKGROUND

The importance of charge detection in quantum computing (QC) is recently emphasized in numerous publications, including the paper "Charge Detection Enables Free-Electron Quantum Computation" by C. W. J. Beenakker, D. P. DiVincenzo, C. Emary and M. Kindermann, Physical Review Letters, Vol. 93, July 2004. Beenakker et al. propose in their theoretical paper that the electrometer scheme will enable "free-electron quantum computation" and parity check.

For scalable and practical QC, numerous physical limitations are expected. QC requires nanoscale fabrication of qubits because the individual qubits must each consist of only a single electron cell. In addition, the tight control of lithographic dimensions of qubits is required, which poses significant challenges in processing of qubits. Furthermore, each qubit must necessarily be addressed through interconnects externally, unlike with conventional Boolean logic based computing in Si CMOS technology. Although the state-of-the-art lithographic tools are utilized for the fabrication of arrays of qubits, some degree of size fluctuations will be present, which leads to a fluctuation in the number of electrons in the qubits. If more than one electron is in a qubit, then this can inhibit proper operation of a QC algorithm. Therefore, prior to an operation of QC algorithm, accurate calibration of each qubit is required to detect if any of the qubits contain more than one electron which would cause computing errors.

Capacitance in quantum dots (q-dots) depends strongly on the discrete density of states (DOS) or charge variation divided by the chemical potential. Thus, a capacitance measurement can, in principle, probe the discrete single electron charging events in q-dots. However, there is significant technical challenge because the capacitance signal is extremely small (10's of aF, i.e. attofarads, $10^{-18}$ Farads) and influenced by parasitic capacitance. Most of the current research has been using a lateral electron transport, which relies on multiple gates and interconnects, for the calibration of individual qubits. However, to develop scalable QC, the lateral transport scheme would not be practical due to its use of high density interconnects in a very limited space as well as peripheral requirements.

Cryogenic capacitance bridge circuits have been utilized to detect a single electron charging event, in which the off-null signal at the balance point is phase-sensitively detected by a cryogenic high electron mobility transistor (HEMT) immersed in LHe3 (an isotope of Helium in liquid state) and dual-channel phase-loop-locked amplifiers outside of the cryostat (i.e. the apparatus needed to maintain the low cryogenic temperature necessary). The total power dissipation of the HEMT transistors used in these measurements is 15 μW at 280 mK (0.28 Kelvin, or about −272.72 degrees Celsius). In the referenced measurements, the input voltage noise is 3 nV/√Hz, yielding charge noise of 0.002 e/√Hz in the case of a 0.1 pF shunt capacitance.

A cryogenic bridge geometry can be used to measure single-electron charging events under air-bridged post gates. The chemical potential change due to the AC excitation amplitude is kept below 200 μeV. The typical excitation frequency (KHz MHz) is determined by the RC charging time in the cryogenic set-up. The speed of the measurement depends on the bandwidth for better signal-to-noise ratio.

SUMMARY

The capacitive read/write scheme in accordance with the present disclosure offers calibration capability compatible with QC architecture, by monitoring local capacitance changes (electrometer) of qubit gates during a write cycle with single electron sensitivity. The qubit "write/read" method and architecture simplify electrical wiring or interconnect schemes since no additional peripheral electron transport measurements are required.

One embodiment of the present disclosure provides a capacitive calibration method for quantum computing, comprising: providing quantum dots comprising post gates; writing to said quantum dots by providing a sequence of write pulses to said quantum dots to induce a single charge population within at least one of said quantum dots, wherein said write pulses are above a threshold value; and reading said quantum dots by measuring the capacitance changes across said quantum dots, wherein the measuring is performed using a cryogenic capacitance bridge circuit.

A further embodiment of the present disclosure provides a capacitive calibrating device comprising: a cryogenic bridge circuit to detect single electron charging events within each of a plurality of quantum dots, wherein designated neighboring pairs of quantum dots form qubits; a first plurality of gates to access said plurality of quantum dots; a second plurality of gates between two quantum dots within a qubit to allow access to perform a swap operation on said two quantum dots; and a third plurality of gates between neighboring qubits to allow access to perform a swap operation on said neighboring qubits.

Another embodiment provides a calibration circuit essentially as depicted in FIGS. 5 and 6.

Further embodiments of the present disclosure are present in the specification, drawings and claims.

BRIEF DESCRIPTION OF THE FIGURES

FIG. 6 is a table of example values for the calibration circuit components of FIG. 5.

DETAILED DESCRIPTION

The present writing discloses a capacitive calibration (read-while-writing) scheme with a single charge sensitive electrometer which can be compatible with a solid-state quantum computing architecture. The disclosed electrometer measures a capacitance change induced by a single charge population and depopulation in q-dots. The sequence of "write" pulses to q-dots above the threshold voltage will induce a single charge population sequentially, which will be read by the capacitance changes. This forms a read/write scheme for quantum computing not limited by the high-density interconnects. The disclosed scheme can be implemented in any semiconductor technologies including Si/SiGe, Si CMOS, and III-V compound semiconductors.

Figure 1:
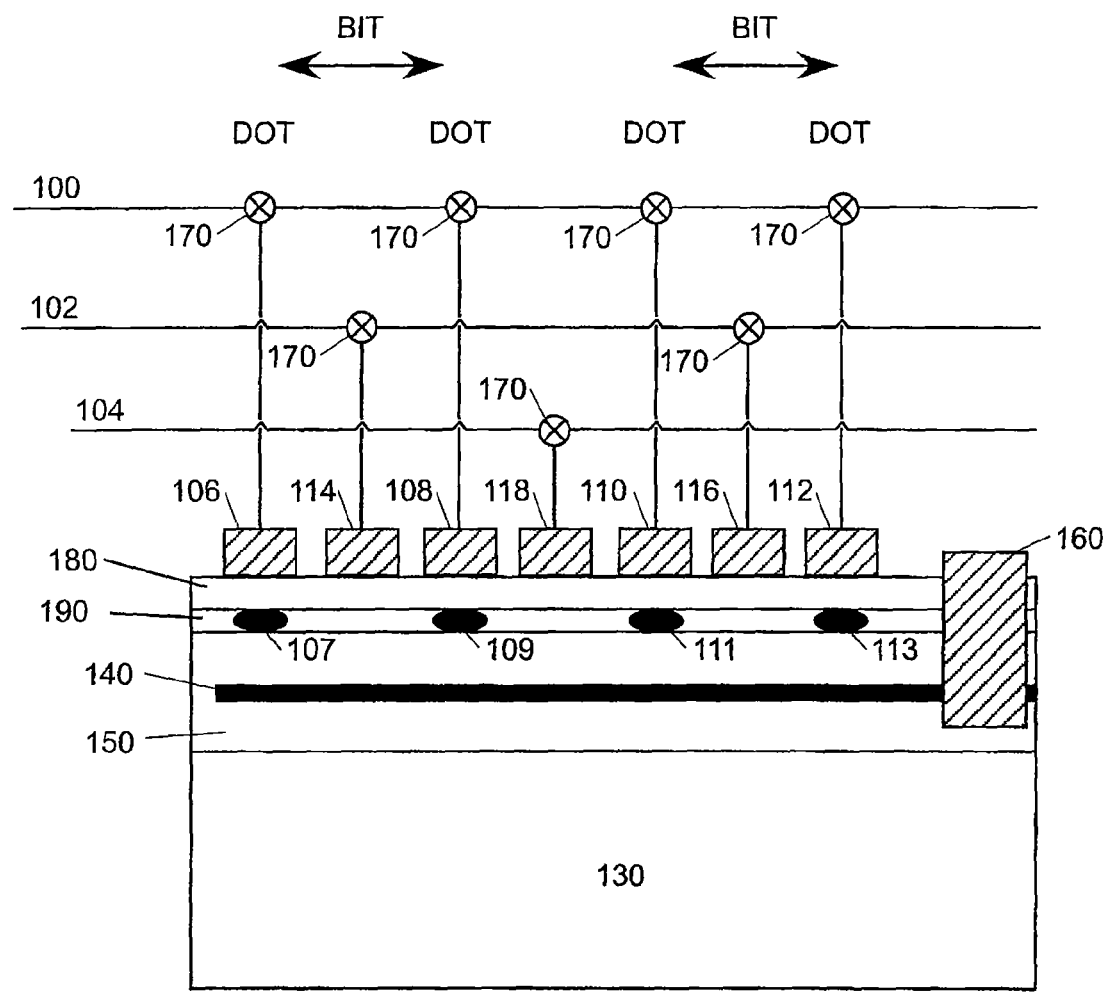
FIG. 1 shows a schematic cross sectional view of the apparatus in accordance with the present disclosure.

FIG. 1 shows an embodiment of electrical gate pulse lines 100, 102, 104 connected to the qubit structure to perform QC. A q-dot charging WRITE pulse on the Read/Write line 100 places a single electron in a gate to form individual q-dots DOT in the induced charge areas 107, 109, 111, 113. A SWAP pulse on the Dot-Swap line 102 between 114, 116 two q-dots 107, 109 or 111, 113 swap the q-dots DOT within each qubit BIT. A swap gate 118 is connected to the Qubit-Swap line 104. A SWAP pulse on the Qubit-Swap line 104 swap the qubits 107+109, 111+113. The various q-gates 106, 108, 110, 112 are on top of spacer layer 180, which is a spacer between the q-gates and the second quantum layer 190. Also included is a substrate 130 and a first quantum layer 140. The first quantum layer 140 is fabricated from a narrow band gap semiconducting material and is a 2DEG electron reservoir, which supplies electrons to second quantum layer 190 during the write cycle. The tunnel barrier layer 150 is fabricated from a wide bandgap semiconducting material. There is an ohmic contact 160 to the layers, which is typically connected to a power source.

During the write cycle, when a charging pulse is applied to the Read/Write line 100, an induced charge area 107, 109, 111, 113 is formed under one or more of the q-dot gates 106, 108, 110, 112. Furthermore, the writing process is carried out by adjusting two specific capacitance parameters, the amplitude of the pulse and the duration of the pulse interval. Since many specific combinations of settings for these two parameters will induce the formation of the induced charge area 107, 109, 111, 113 these two parameters are calibrated to determine the combination settings for these two parameters that will induce the formation of the induced charge area 107, 109, 111, 113. The two q-dots DOT of any given qubit BIT can be swapped by a pulse delivered on the Dot-Swap line 102. Two adjoining qubits BIT can be swapped by a pulse delivered on the Qubit-Swap line 104. The pulses described above can be delivered to the appropriate gates by providing a multiplexed signal down each line 100, 102, 104, then de-multiplexing via de-multiplexing circuitry 170 corresponding to each gate.

Figure 2:
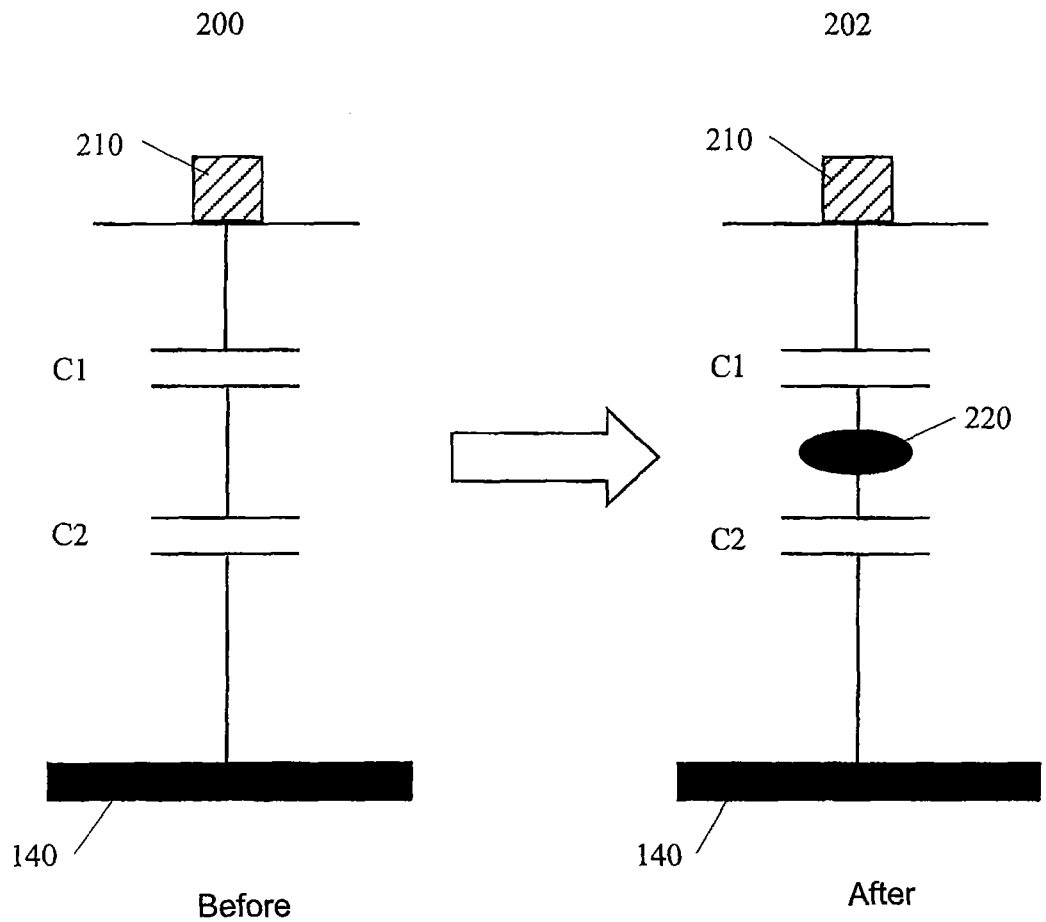
FIG. 2 is a schematic diagram useful for the understanding of the principle of operation of the device of FIG. 1.
Figure 5:
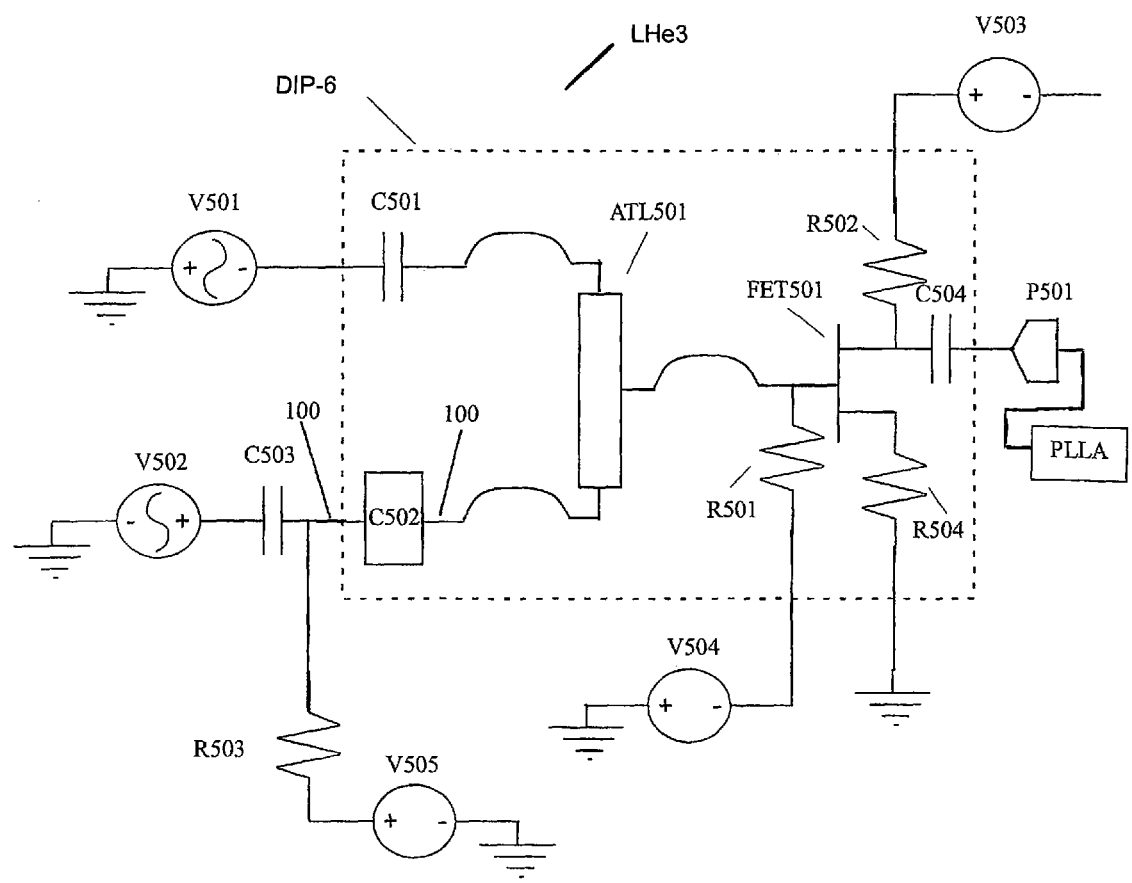
FIG. 5 is an electrical diagram showing a calibration circuit.

FIG. 2 shows a capacitance change before 200 and after 202 the single electron charging in a q-dot. The transition indicates a successful "write" operation. There is a capacitance C1 between the gate 210 and the q-dot 220. There is also a capacitance C2 between the q-dot 220 and the 2DEG reservoir 140. The total capacitance is a function of those two capacitances, which changes depending on whether or not there is an electron in the q-dot induced charge area 220, as shown below. An integrated calibration circuit on the CMOS interface circuitry can be designed to automatically calibrate the charge state of each q-dot in a given array by multiplexing through each of the q-dots sequentially. An example of such calibration circuit is shown in FIG. 5. This alleviates the space requirement of having to provide a separate transistor for each q-dot.

Figure 3:
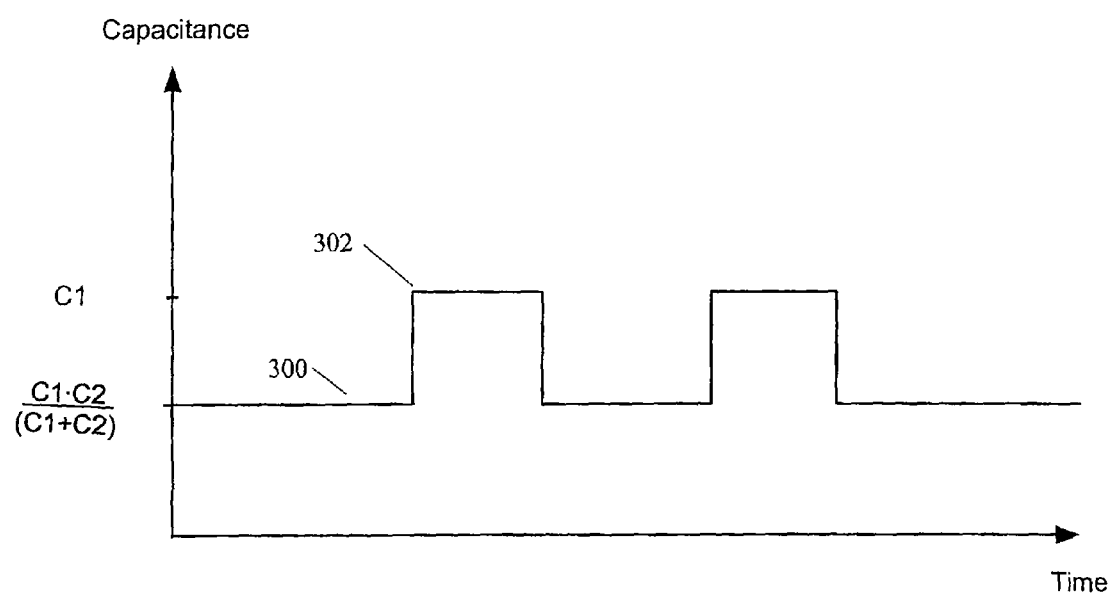
FIG. 3 is a time vs. capacitance diagram showing variation of capacitance on the capacitor arrangements of FIGS. 1 and 2.

FIG. 3 is a graph showing the amplitude of the capacitance pulse vs. the capacitance pulse interval duration. These two variables are adjusted during a write/read operation. When the capacitance increases, as shown by the pulse wave 302, the read operation occurs. The duration of the pulse corresponds to the length of the calibration cycle. The baseline capacitance 300 (no electron in the induced charge area) is $$\frac{C1 \cdot C2}{C1 + C2}$$

whereas the q-dot capacitance 302 (indicating an electron in the induced charge area) is C1.

A multiplexing technique can be used to access each q-dot within a given array allowing full calibration of the arrays prior to each quantum computing operation. For instance, during the calibration steps, capacitance of q-dots can be monitored locally and in-situ while DC biases are applied to form dots beneath the qubit gates. Due to the energy level of q-dots quantized in Darwin-Fock-like spectra, the capacitance versus DC bias will show peaks when the q-dot is charged by a single electron for the 2DEG reservoir. This provides an elegant way to perform qubit "Write/Read" action substantially simultaneously and thus calibrating the q-dot.

Figure 4:
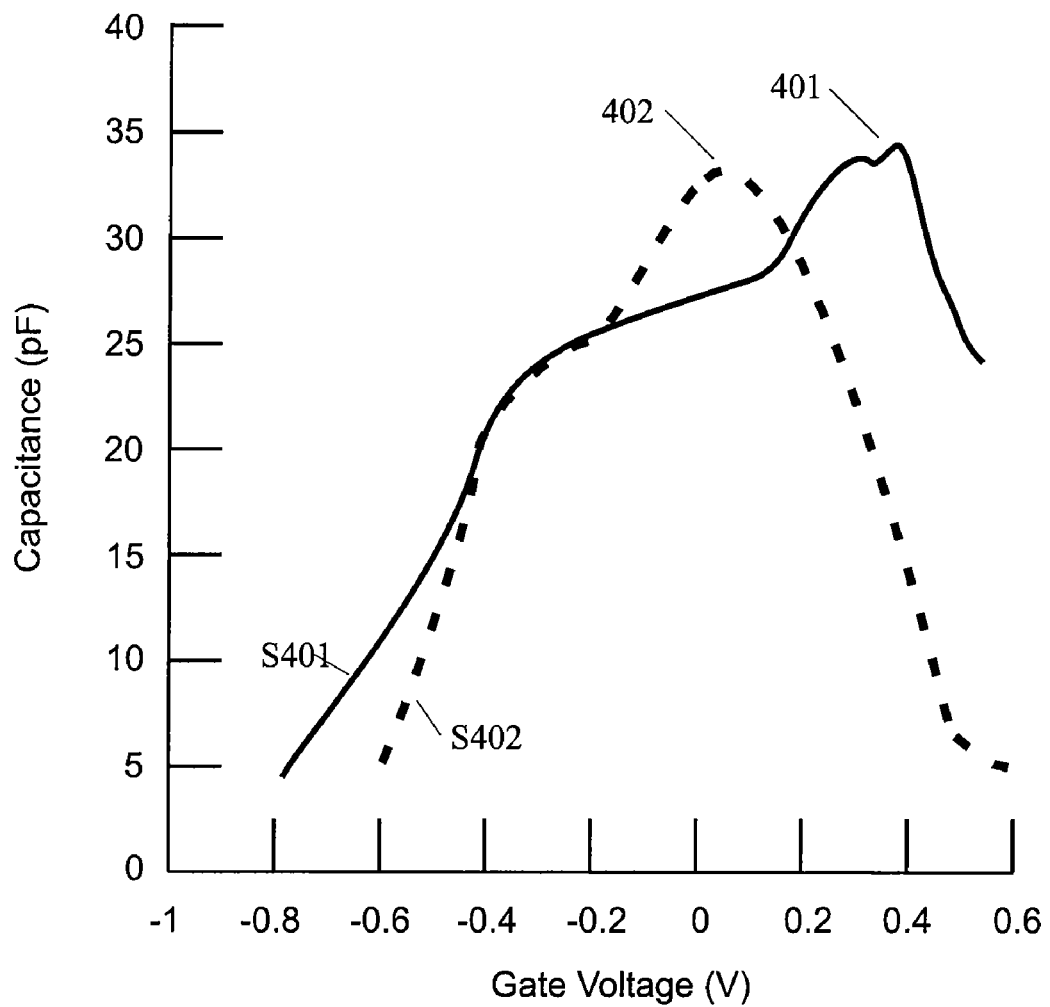
FIG. 4 is a gate voltage vs. capacitance diagram showing approximate measured capacitance changes due to a charge onset.

FIG. 4 shows the relationship between the Capacitance (pF) and the Gate Voltage (V) for the q-bit being measured. In FIG. 4, the two curves shown are 8401, which depicts the onset of capacitance and S402, which depicts a reference sample. The peak in capacitance 401 depicted by S401 corresponds to the peak in capacitance 302 shown in FIG. 3. The implementation of the invention depicted in FIG. 4 produces the output similar to what is shown as S401. Further, if second quantum layer 150 (FIG. 1) is not present in the implementation of the invention, then a curve similar to 8402 is produced with a different peak capacitance 402.

FIG. 5 is an example of a circuit diagram for an embodiment of a cryogenic capacitance bridge circuit adapted for q-bit calibration (here shown as a six-port dual inline package, or DIP-6) with a charge noise of approximately 0.02 e/√Hz when in cryogenic state. The circuit consists of five current sources, two AC V501, V502 and three DC V503, V504, V505, three capacitors C501, C503, C504, four resistors R501, R502, R503, R504, one Alumina Transmission line ATL501, and a I-1519 1×25 μm HEMT FET501. C502 is the device to be calibrated (which can be represented by its capacitance). The circuit elements are connected as shown in the diagram, including the DIP output port P501. The characteristics of the circuit elements are given in the table of FIG. 6. The "capacitor" C502 is actually the q-dot (or arrangement of q-dots/q-bits as shown in FIG. 1) to be calibrated—the line 100 connecting C502 to the rest of the circuit is the "write" line of the q-dot device. The capacitor C501 is the reference capacitor for the measurement. The DIP-6 can be immersed in LHe3 for cryogenic operation. The output P501 can be amplified by a dual-channel phase-loop-locked amplifier PLLA outside of the LHe3.

FIG. 6 is a table depicting an example of values for the elements of FIG. 5. Since element C502 is the q-bit device to be measured, the capacitance value is "to be determined"

(TBD). One skilled in the art could devise other values to use for the elements based on the arrangement and values provided in this disclosure.

The qubit method according to this disclosure simplifies electrical writing or interconnect schemes since additional peripheral electron transport measurements are not required. The maximum AC excitation amplitude will be limited by energy spacing between singlet and triplet separation in a given magnetic field. For a small number of dots (e.g. 100), the multiplexed calibration procedure can be accomplished in milliseconds. A separate calibration circuit can be integrated with each of the qubit cells, enabling each cell calibrated independently and automatically.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

What is claimed is:

1. A capacitive calibration method for quantum computing, comprising:
    providing at least one quantum dot;
    providing a cryogenic capacitance bridge circuit connected to the quantum dot via a read/write line;
    writing to a quantum dot of said at least one quantum dot by providing a write pulse on the read/write line to a gate accessing said quantum dot to induce a single charge population within said quantum dot, wherein said write pulse is above a threshold voltage value; and
    reading said quantum dot by measuring capacitance changes across said quantum dot, wherein the measuring is performed by the cryogenic capacitance bridge circuit.

2. The method of claim 1, wherein the cryogenic capacitance bridge circuit includes a high electron mobility transistor (HEMT).

3. The method of claim 1, further comprising determining by said reading if said writing to said quantum dot induced said single charge population.

4. The method of claim 1, wherein the writing to said quantum dots is performed by said cryogenic capacitance bridge circuit providing the write pulse to the read/write line.

5. The method of claim 1, further comprising immersing said quantum dot and said cryogenic capacitance bridge circuit in an isotope of liquid helium in order to reduce the temperature of the cryogenic capacitance bridge circuit.

6. The method of claim 1, further comprising a dual-channel phase-loop-locked amplifier adapted to amplify an output of the cryogenic capacitance bridge circuit.

7. The method of claim 1, further comprising performing a swap operation on adjoining quantum dots, said adjoining quantum dots forming a pair of quantum dots, by providing swap dot pulses to a first set of swap gates positioned between two quantum dots to be swapped.

8. The method of claim 7, further comprising swapping adjoining pairs of quantum dots by providing swap qubit pulses to a second set of swap gates positioned between two pairs of quantum dots to be swapped.

9. The method of claim 1, wherein the reading includes detecting peak capacitance point in relation to gate voltage.

10. The method of claim 1, wherein multiple q-dots are calibrated by multiplexing the write pulse with other write pulses.

11. A capacitive calibration system comprising:
    a cryogenic capacitance bridge circuit and one or more quantum dots to be tested within the cryogenic capacitance bridge circuit by connecting the one or more quantum dots to the cryogenic capacitance bridge circuit via a read/write line; wherein the cryogenic capacitance bridge circuit is structured such that it detects a single electron charging event in each of said one or more quantum dots; and a write pulse on the read/write line to a gate accessing said quantum dot to induce a single charge population within said quantum dot, wherein said write pulse is above a threshold voltage value.

12. The system of claim 11, further comprising:
    a first plurality of gates providing access to each of said one or more quantum dots, wherein designated neighboring pairs of quantum dots form qubits, said qubits each including two quantum dots.

13. The system of claim 12, further comprising:
    a second plurality of gates, wherein each of said second plurality of gates provides access between the two quantum dots within each said qubit to allow a swap operation on said two quantum dots.

14. The system of claim 13, further comprising:
    a third plurality of gates between neighboring qubits to allow access to perform a swap operation on said neighboring qubits.

15. The system of claim 11, wherein the cryogenic capacitance bridge circuit further includes a high electron mobility transistor (HEMT).

16. The system of claim 14, further comprising de-multiplexing circuits on lines connected to the first plurality of gates, the second plurality of gates, and the third plurality of gates.

17. The system of claim 11, further comprising a dual-channel phase-loop-locked amplifier adapted to amplify the output of the cryogenic capacitance bridge circuit.

* * * * *